US009997217B1

(12) United States Patent
Goel et al.

(10) Patent No.: US 9,997,217 B1
(45) Date of Patent: Jun. 12, 2018

(54) WRITE ASSIST CIRCUITRY

(71) Applicant: ARM Limited, Cambridge (GB)

(72) Inventors: Ankur Goel, Noida (IN); Munish Kumar, Noida (IN); Nitin Jindal, Noida (IN); Rahul Mathur, Austin, TX (US); Shruti Aggarwal, Noida (IN); Bikas Maiti, Austin, TX (US); Yew Keong Chong, Austin, TX (US)

(73) Assignee: ARM Limited, Cambridge (GB)

( * ) Notice: Subject to any disclaimer, the term of this patent is extended or adjusted under 35 U.S.C. 154(b) by 0 days. days.

(21) Appl. No.: 15/477,516

(22) Filed: Apr. 3, 2017

(51) Int. Cl.
*G11C 7/10* (2006.01)
*G11C 7/12* (2006.01)
*G11C 8/16* (2006.01)
*G11C 8/18* (2006.01)
*G11C 7/20* (2006.01)

(52) U.S. Cl.
CPC ............. *G11C 7/12* (2013.01); *G11C 7/1048* (2013.01); *G11C 7/1096* (2013.01); *G11C 7/20* (2013.01); *G11C 8/16* (2013.01); *G11C 8/18* (2013.01)

(58) Field of Classification Search
CPC ....... G11C 7/12; G11C 7/1048; G11C 7/1096; G11C 7/20; G11C 8/16; G11C 8/18
USPC .................................................. 365/189.04
See application file for complete search history.

(56) References Cited

U.S. PATENT DOCUMENTS

2015/0146470 A1* 5/2015 Katoch .................... G11C 7/22
365/72
2015/0146479 A1* 5/2015 Pilo ....................... G11C 11/419
365/156

OTHER PUBLICATIONS

Karl, et al.; A 0.6 V, 1.5 GHz 84 Mb SRAM in 14 nm FinFET CMOS Technology With Capacitive Charge-Sharing Write Assist Circuitry; IEEE Journal of Solid-State Circuits; vol. 51, No. 1, pp. 222-229; Jan. 2016. DOI: 10.1109/JSSC.2015.2461592.
Karl, et al.; A 4.6GHz 162Mb SRAM Design in 22nm Tri-Gate CMOS Technology with Integrated Active VMIN-Enhancing Assist Circuitry; ISSCC 2012, Session 13; Feb. 2012. DOI: 10.1109/ISSCC.2012.6176988.

* cited by examiner

*Primary Examiner* — Huan Hoang
(74) *Attorney, Agent, or Firm* — Pramudji Law Group PLLC; Ari Pramudji

(57) ABSTRACT

Various implementations described herein are directed to an integrated circuit having core circuitry with an array of memory cells arranged in columns. The integrated circuit may include write assist circuitry having a column selector that accesses the memory cells via a bitline coupled to each of the columns. The write assist circuitry may include a first node that couples the column selector to a discharge circuit and a feedback circuit. The write assist circuitry may include a second node that couples a trigger circuit to the discharge circuit and the feedback circuit. The trigger circuit enables the discharge circuit, discharges the second node, and is disabled after discharging the second node. The discharge circuit discharges the first node, and the feedback circuit tracks the first node and disables the discharge circuit.

20 Claims, 7 Drawing Sheets

WRITE ASSIST CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Some schemes for write assist have been suggested for lowering core voltage supply (Vddc). However, these conventional schemes may be difficult to implement. For example, some of these schemes rely on a voltage divider to generate an intermediate value of Vddc that is lower than a full core voltage supply. As such, this scheme suffers from huge DC power aggregation during generation of the intermediate voltage in each bitcell column, which results in huge dynamic power during a write operation.

In another example, some of these schemes offer a solution that uses charge sharing between fully charged Vddc and a pre-discharged capacitor with assist of a route over a core bitcell array. Even though this scheme may not utilize a DC path, area penalty of this scheme is significantly large. As such, there exists a need to improve conventional schemes for lowering Vddc write assist in memory applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to write assist circuitry for memory applications. In some implementations, the write assist circuitry described herein may refer to Vddc lowering write assist circuitry, wherein Vddc refers to a core voltage supply. In other implementations, the write assist circuitry described herein may refer to a negative feedback based core supply (Vddc) lowering scheme for write assist in static random access memory (SRAM) applications. This scheme and various circuitry related thereto provides write assist functionality that operates within a negative feedback based system. This scheme further enables Vddc lowering write assist in SRAM with low area overhead and no DC current path as in conventional schemes and is competitive in speed, over a range of memory size and across various voltage domains.

Various implementations of write assist circuitry will now be described in greater detail herein with reference to FIGS. 1A-4.

Figure 1A:
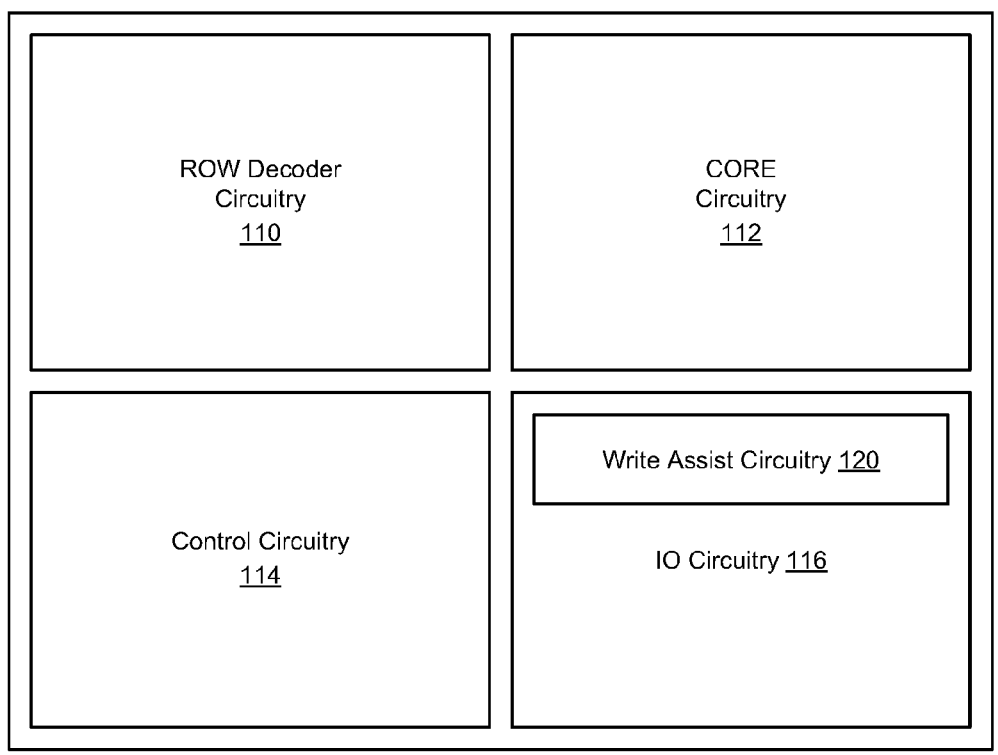
FIGS. 1A-1C illustrate various diagrams of memory circuitry in accordance with various implementations described herein.
Figure 1B:
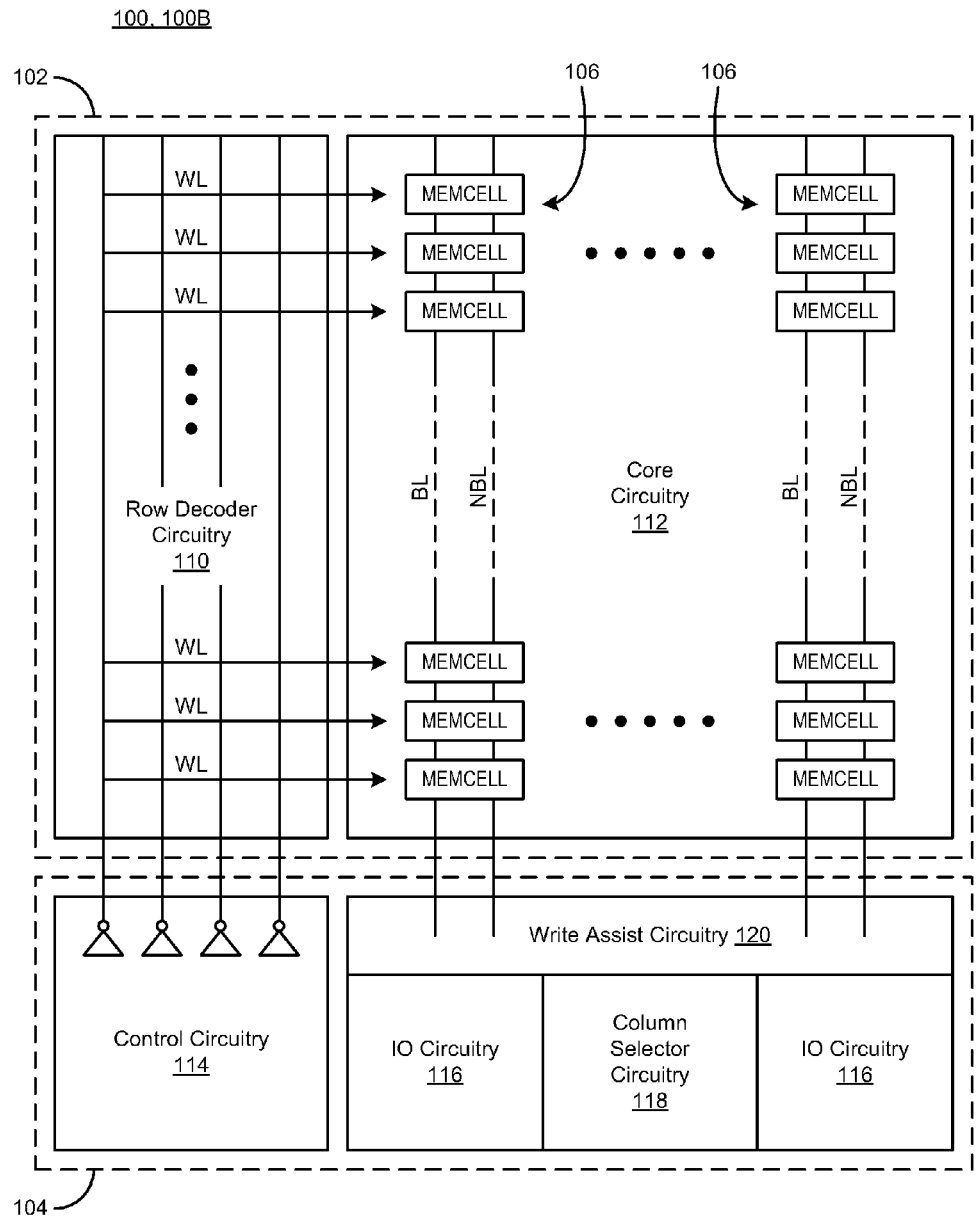
Figure 1C:
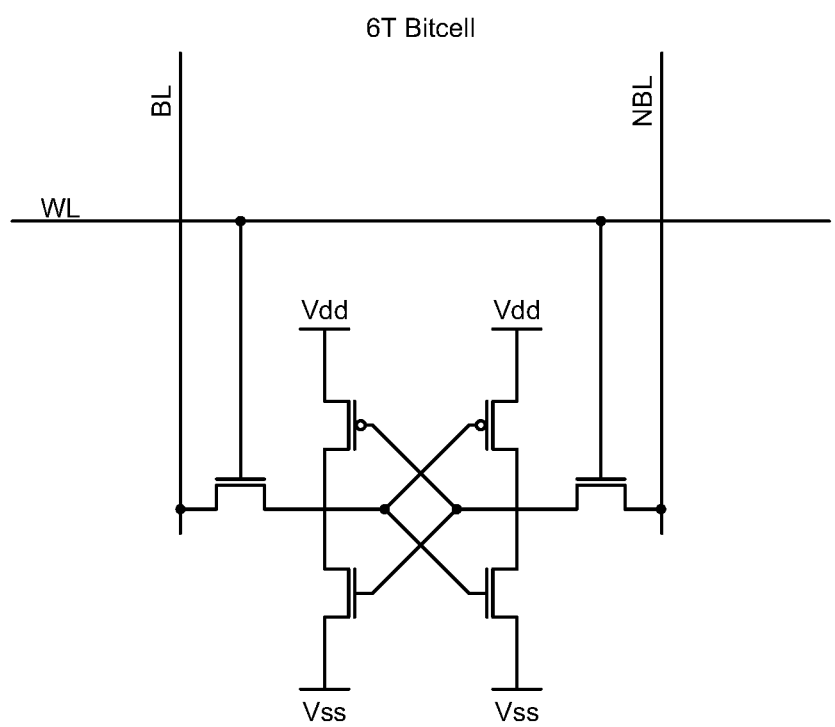

FIGS. 1A-1C illustrate various diagrams of memory circuitry in accordance with various implementations described herein. In particular, FIG. 1A illustrates a block diagram 100A of the memory circuitry 100, FIG. 1B illustrates a more detailed diagram 100B of the memory circuitry 100, and FIG. 1C illustrates a schematic diagram 100C of memory cell circuitry 130 that may be utilized in the memory circuitry 100.

As shown in FIG. 1A, the memory circuitry 100 may include core circuitry 112 that utilizes row decoder circuitry 110, control circuitry 114, and input/output (IO) circuitry 116 having write assist circuitry 120. As shown in FIG. 1B, the core circuitry 112 may include an array of memory cells 106 arranged in columns and rows. The write assist circuitry 120 may include column selector circuitry 118 that accesses the memory cells 106 via one or more bitlines (e.g., BL, NBL) coupled to each of the columns. The core circuitry 112 may utilize the row decoder circuitry 110 to access the memory cells 106 via one or more wordlines WL. The control circuitry 114 may include write driver circuitry (not shown) coupled to the row decoder circuitry 110 and the column selector circuitry 118 to select each memory cell 106 in the array of memory cells with a wordline signal and a bitline signal. The write driver circuitry may write data to a selected memory cell 106 during a write cycle via a selected wordline (WL) and a selected bitline (BL, NBL).

As further shown in FIG. 1B, the memory circuitry 100 may include a core 102 with periphery portion 104 having the column selector circuitry 114 (which may be referred to as a column decoder (COLDEC)) with the IO circuitry 116 that may access each of the memory cells 106 via a selected bitline (BL, NBL). The selected bitline (BL, NBL) may include a selected pair of complementary bitlines (BL/NBL, . . . , BLn/NBLn). The control circuitry 114 may receive one or more control signals, such as, e.g., address signals (A) and clock signals (CLK). In some cases, the IO circuitry 116 may include bitline precharge circuitry that may be used to precharge the bitlines (BL/NBL, . . . , BLn/NBLn).

The memory circuitry 100 may be implemented as an integrated circuit (IC) with various types of memory, such as, e.g., random access memory (RAM), and/or any other types of memory, including any type of volatile memory and non-volatile memory. In some implementations, the memory circuitry 100 may be implemented as an IC with various dual rail memory architectures. In other implementations, the memory circuitry 100 may be integrated with computing circuitry and related components on a single chip. Further, the memory circuitry 100 may be implemented in an embedded system for various types of electronic, mobile, and biometric applications.

As shown in FIG. 1C, each memory cell 106 in the core circuitry 112 may be referred to as a bitcell, and each memory cell 106 may be configured to store at least one data bit value (e.g., a data value associated with logical '0' or '1'). The array of memory cells 106 of the core circuitry 112 may include any number of memory cells or bitcells arranged in various configurations, such as, e.g., a two-dimensional (2D) memory array having columns and rows of multiple memory cells arranged in a 2D grid pattern with 2D indexing capabilities. Further, each memory cell 106 may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are two types of structures: one-wordline devices and multi-wordline devices. One wordline devices (e.g., ROM, DRAM, SRAM) refer to a devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, careful optimization of design memory assist circuits may be used to deliver low power memory operation.

As shown in FIG. 1C, static RAM bitcells may include a 6T bitcell, which may have access ports controlled by wordlines. In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in a left half array and a right half array.

Figure 2:
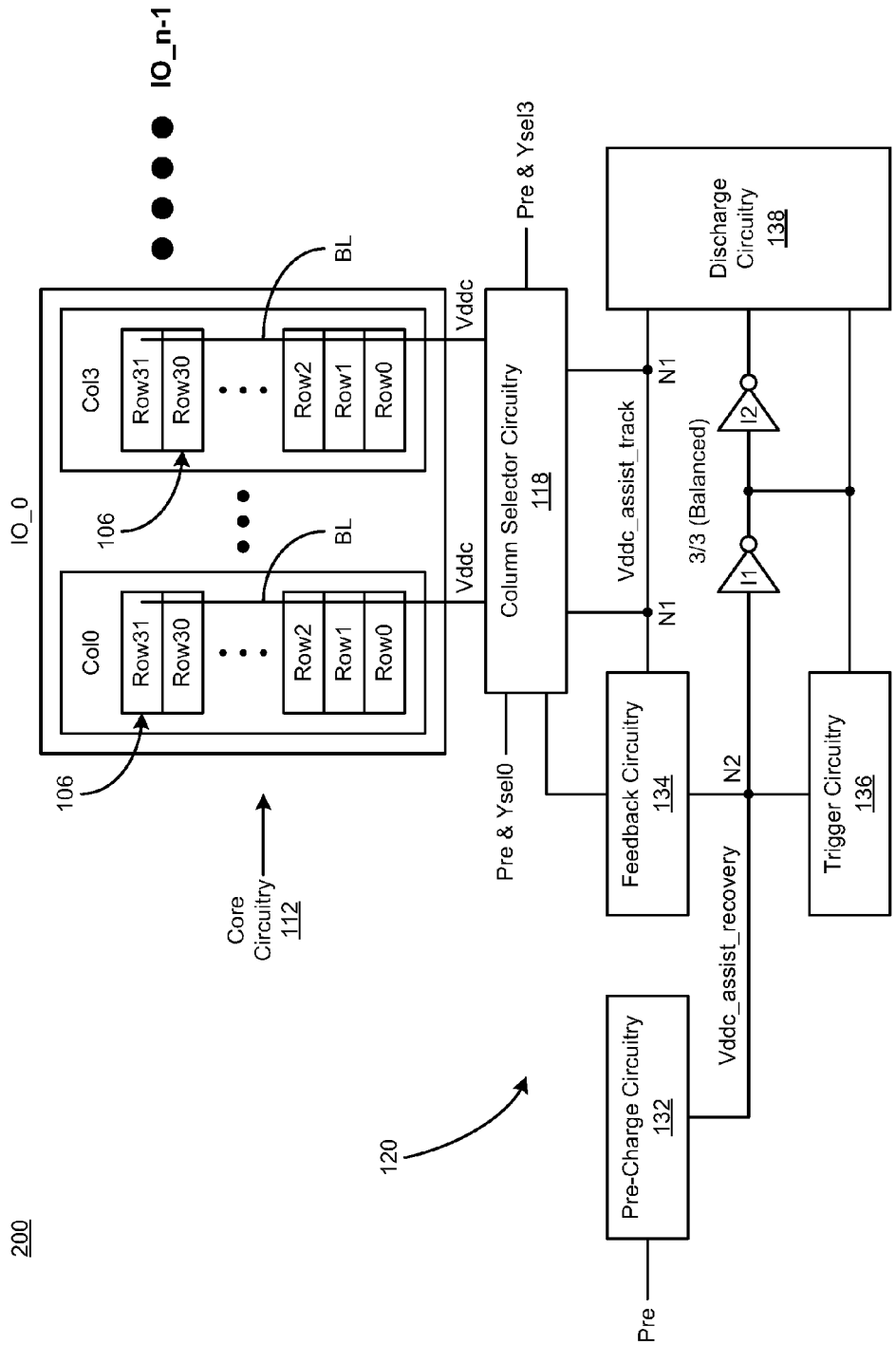
FIG. 2 illustrates a diagram of write assist circuitry in accordance with various implementations described herein.

FIG. 2 illustrates a diagram 200 of the write assist circuitry 120 in accordance with various implementations described herein.

The core circuitry 112 may include an array of memory cells 106 arranged in columns (e.g., Col0, . . . , Col3) and rows (e.g., Row0, . . . , Row31). In some cases, these columns may be grouped in one or more IO circuit blocks IO_0, . . . , IO_n−1. The core circuitry 112 may operate with a core voltage supply (Vddc) in various voltage domains, including, e.g., a low voltage supply of less than 0.5V. The voltage range may vary with technology. For instance, the core circuitry 112 may operate at the core supply voltage Vddc, and other circuitry, such as the write assist circuitry 120 may operate at a peripheral supply voltage Vddp that is different than the core supply voltage Vddc.

The write assist circuitry 120 may include column selector circuitry 118 that may access the memory cells 106 via a bitline (BL) coupled to each of the columns (e.g., Col0, . . . , Col3). The write assist circuitry 120 may include multiple circuits including the column selector circuitry 118, the discharge circuitry 138, the feedback circuitry 134, and the trigger circuitry 136 that are arranged to perform a write assist operation. As shown, the column selector circuitry 118 may receive various signals, such as, e.g., pre-charge signal (Pre) and selection signals (Ysel0, . . . , Ysel3).

The write assist circuitry 120 may include a first node N1 that couples the column selector circuitry 118 to discharge circuitry 138 and feedback circuitry 138. The first node N1 may be referred to as a tracking node that may track a core supply voltage (Vddc) with a tracking node voltage (e.g., Vddc_assist_track). The discharge circuitry 138 may be utilized to discharge the first node N1.

The write assist circuitry 120 may include a second node N2 that couples trigger circuitry 136 to the discharge circuitry 138 and the feedback circuitry 134. The second node N2 may be referred to as a recovery node that discharges a core supply voltage (Vddc) with a recovery node voltage (e.g., Vddc_assist_recovery).

The trigger circuitry 136 may enable the discharge circuitry 138, and the trigger circuitry 136 may be utilized to discharge the second node N2. Further, the trigger circuitry 136 may be disabled after discharging the second node N2. The trigger circuitry 135 may trigger the write assist circuitry 120 to enable the discharge circuitry 138, and the trigger circuitry 136 may be non-operational during non-write cycles including read cycles.

The feedback circuitry 134 may be utilized to track the first node N1, and the feedback circuitry 134 may also be utilized to disable the discharge circuitry 138. In some cases, during a write cycle, the feedback circuitry 134 may track the first node N1 and may disable the discharge circuitry 138 to complete a write assist operation.

The write assist circuitry 120 may include precharge circuitry 132 that enables the write assist circuitry 120 during write cycles. The second node N2 may couple the precharge circuitry 132 to the feedback circuitry 134, the discharge circuitry 138, and the trigger circuitry 136. The precharge circuitry 132 may disable the write assist circuitry 120 during non-write cycles including read cycles. As shown, the pre-charge circuitry 132 may receive one or more signals, such as, e.g., the pre-charge signal (Pre).

The write assist circuitry 120 may include one or more various other circuit components. For instance, the write assist circuitry 120 may include one or more inverters (e.g., I1, I2) interposed between the second node N2 and the discharge circuitry 138. The inverters (I1, I2) may be balanced, such as, e.g., 3/3 balanced.

Figure 3A:
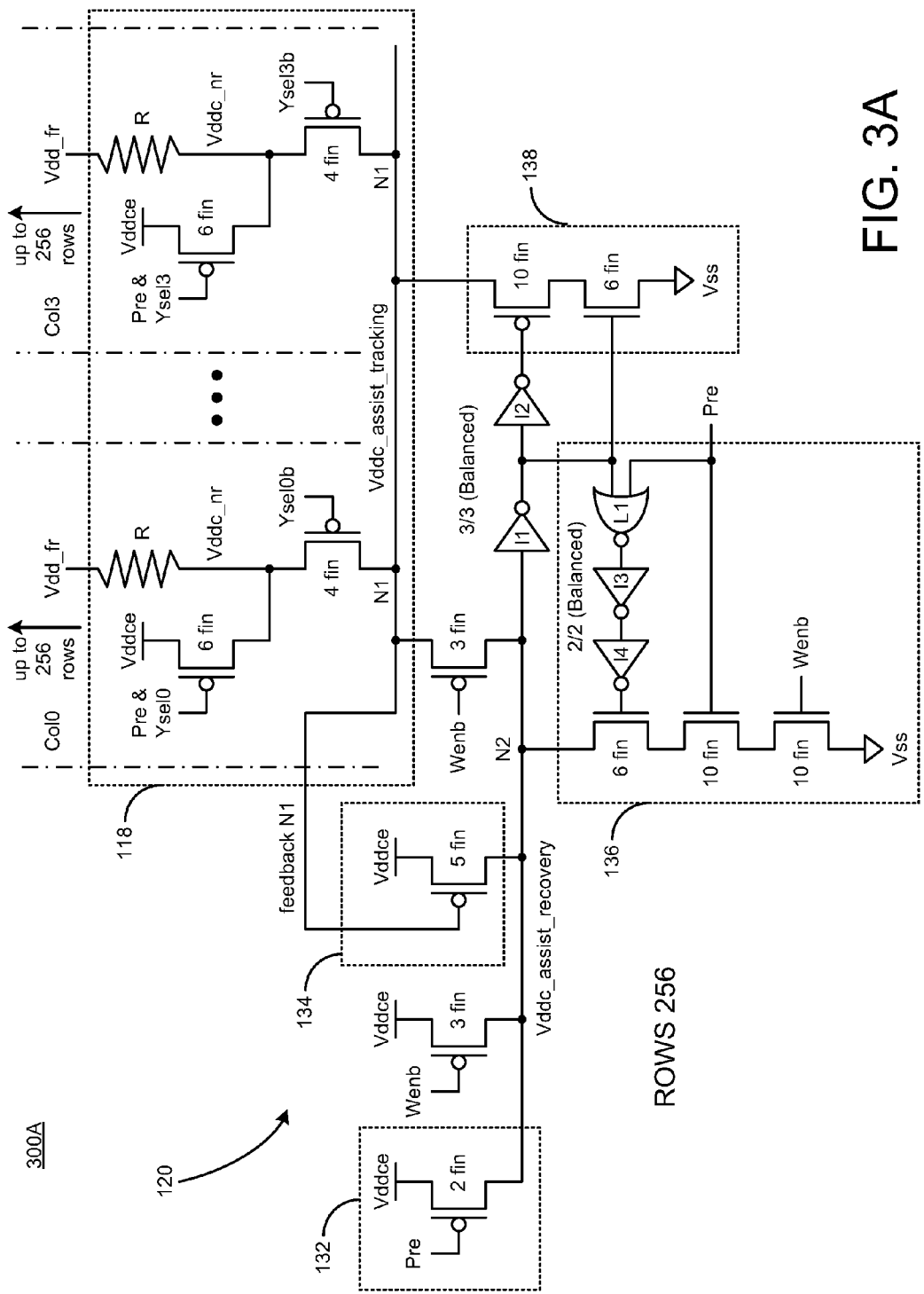
FIGS. 3A-3B illustrate various schematic diagrams of write assist circuitry in accordance with various implementations described herein.
Figure 3B:
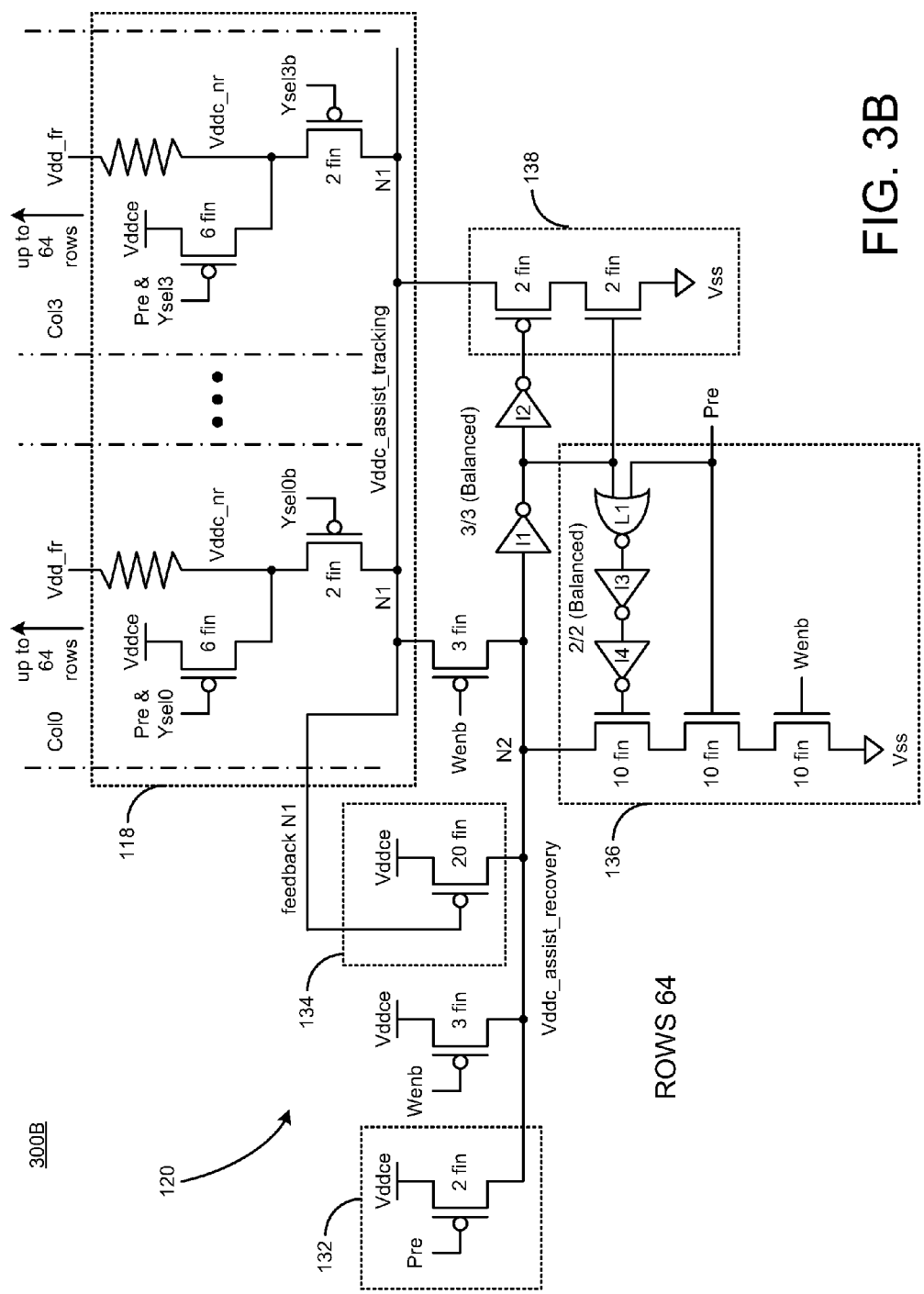

FIGS. 3A-3B illustrate various schematic diagrams of the write assist circuitry 120 in accordance with various implementations described herein. In particular, FIG. 3A illustrates a schematic diagram 300A of the write assist circuitry 120 for some memory applications that utilize 256 rows, and FIG. 3B illustrates a schematic diagram 300B of the write assist circuitry 120 for some memory applications that utilize 64 rows.

FIG. 3A provides an implementation of the write assist circuitry 120 for 256 rows. The column selector circuitry 118 may include various circuit components that are arranged to assist with write operations as described herein. For each column (Col0, . . . , Col3), the column selector circuitry 118 may include at least one resistor (R) and one or more PMOS transistors, such as, e.g., a 6 fin FET and a 4 fin FET. Further, as shown, for each column (Col0, . . . , Col3), the 6 fin FET may receive the pre-charge signal (Pre) and a corresponding selection signal (Ysel0, . . . , Ysel3), and the 4 fin FET may receive a corresponding complementary selection signal (Ysel0b, . . . , Ysel3b). The column circuitry 118 may operate with the core voltage supply (Vddc or Vddce).

In some implementations, the Pre signal may be a mix of GTP (Bank0 & Bank1; both if multi-bank), a write signal, and an enable signal (LREN). These signals may mix in the control circuitry 114. There may be no coupling between N1 (Vddc_assist-track) and N2 (Vddc_assist_recovery). Further, rate of discharge of Vddc may be small (e.g., a minimal IR drop between Vddc_nr and VDDC_fr), and there may be a constraint between a minimal voltage to write versus a minimal retention voltage.

As shown in FIG. 3A, the write assist circuitry 120 and the circuits 132, 134, 136, 138 may utilize one or more circuit components, such as, e.g., P-type (PMOS) and N-type (NMOS) transistors, including finFET devices, such as, e.g., various P-type finFET devices (fin PFET) and various N-type finFET devices (fin NFET). For instance, the precharge circuit 132 may include a P-type (PMOS) transistor, such as, e.g., a 2 fin PFET, that receives the core voltage supply Vddce and the pre-charge signal (Pre).

In another instance, the feedback circuit 134 may include a P-type (PMOS) transistor, such as, e.g., a 5 fin PFET, that receives the core voltage supply Vddce and the Vddc_assist_recovery voltage from the first node N1.

In some scenarios, a P-type (PMOS) transistor, such as, e.g., a 3 fin PFET, may be coupled between the pre-charge circuit 132 and the feedback circuit 134, and this 3 fin PFET receives the core voltage supply Vddce and an enable signal (Wenb). Further, in some scenarios, another P-type (PMOS) transistor, such as, e.g., another 3 fin PFET, may be coupled between the first node N1 and the second node N2, and this 3 fin PFET receives the enable signal (Wenb).

The discharge circuit 138 may include multiple transistors including a P-type (PMOS) transistor, such as, e.g., a 10 fin PFET, and an N-type (NMOS) transistor, such as, e.g., a 6 fin NFET. As shown, these transistors may be coupled between the first node N1 and a ground voltage supply (Vss). Also, the second node N2 may be coupled to a gate of the 10 fin PFET of the discharge circuit 138 via the inverters I1, I2. Further, a gate of the 6 fin NFET of the discharge circuit 138 may be coupled to the trigger circuitry 136 and also may be coupled to the second node N2 between the inverters I1, I2.

The trigger circuit 136 may include multiple transistors including multiple N-type (NMOS) transistors, such as, e.g., a 6 fin NFET, a 10 fin NFET, and another 10 fin NFET, that are stacked between the second node N2 and the ground voltage supply (Vss). Also, a gate of the 10 fin PFET is coupled to the second node N2 via the inverters I1, I2. Further, a gate of the 6 fin NFET is coupled to the trigger circuitry 136 and also to the second node N2 between the inverters I1, I2. Multiple components, such as, e.g., a NAND gate L1, and inverters I3, I4, may be coupled in series to a gate of the 6 fin NFET of the trigger circuitry 136, and the gate of the 6 fin NFET of the discharge circuitry 138 may be coupled to an input of the NAND gate L1. The pre-charge signal (Pre) may be provided to the 10 fin NFET of the trigger circuitry 136 and another input of the NAND gate L1. The enable signal (Wenb) may be provided to the other 10 fin NFET of the trigger circuitry 136.

In some implementations, the pre-charge circuitry 132 operates to enable the write assist circuitry 120 during a write cycle; otherwise, the pre-charge circuitry 132 keeps the write assist circuitry 120 disabled. The trigger circuitry 136 operates to trigger the write assist circuitry 120, which enables the discharge circuitry 138 and may shut-off after discharging Vddc_assist_recovery at the second node N2. During non-write cycles, the trigger circuitry 136 is disabled and thus non-operational. The discharge circuitry 138 operates to discharge Vddc_assist_tracking at the first node N1, which is lowering the core voltage supply (Vddc). The feedback circuitry 134 operates to turn by tracking the node voltage Vddc_assist_tracking at the first node N1, which is lowering the core voltage supply (Vddc) and shuts-off the discharge circuitry 138 to complete a write operation.

In some implementations, the write assist circuit 120 operates as follows. When a write operation starts, the Pre signal goes to 1 (i.e., voltage value for logic 1), and the Ysel signal goes to 0 (i.e., voltage value for logic 0). The Pre signal going to 1 will shut-off the pre-charge PMOS 132, which disables the pre-charge PMOS 132 and triggers the discharge of the vddc_assist_recovery node N2. This will turn on the discharge circuit 138, and the trigger circuit 136 will shut-off after the discharge logic 138 is turned on. The discharge circuit 138 will start to bring the core voltage supply Vddc down by bringing the Vddc_assist_tracking node N1 down. The Vddc_assist_tracking node N1 will eventually turn on the feedback PMOS 134, which will start pre-charging the Vddc_assist_recovery node N2. The vddc_assist_recovery node N2 will pre-charge and shut-off the discharge circuit 138, thus marking an end of the write assist operation. When the Pre signal goes to 0 (i.e., voltage value for logic 0) and the Ysel signal goes to 1 (i.e., voltage value for logic 1), the core supply Vddc and the Vddc_assist_recovery node N2 is pre-charged.

The write assist circuitry 120 may be altered or modified to accommodate any number rows in memory. For instance, FIG. 3B provides another implementation of the write assist circuitry 120 for 64 rows. As shown, some of the transistors may be different than FIG. 3A. In the column selector circuitry 118, the 4 fin PFET may be changed to a 2 fin PFET for each column (Col0, . . . , Col3). In the feedback circuitry 134, the 5 fin PFET may be changed to a 20 fin PFET. In the discharge circuitry 138, the 10 fin PFET may be changed to a 2 fin PFET, and the 6 fin NFET may be changed to a 2 fin NFET. Further, in the trigger circuitry 136, the 6 fin NFET may be changed to a 10 fin NFET.

Figure 4:
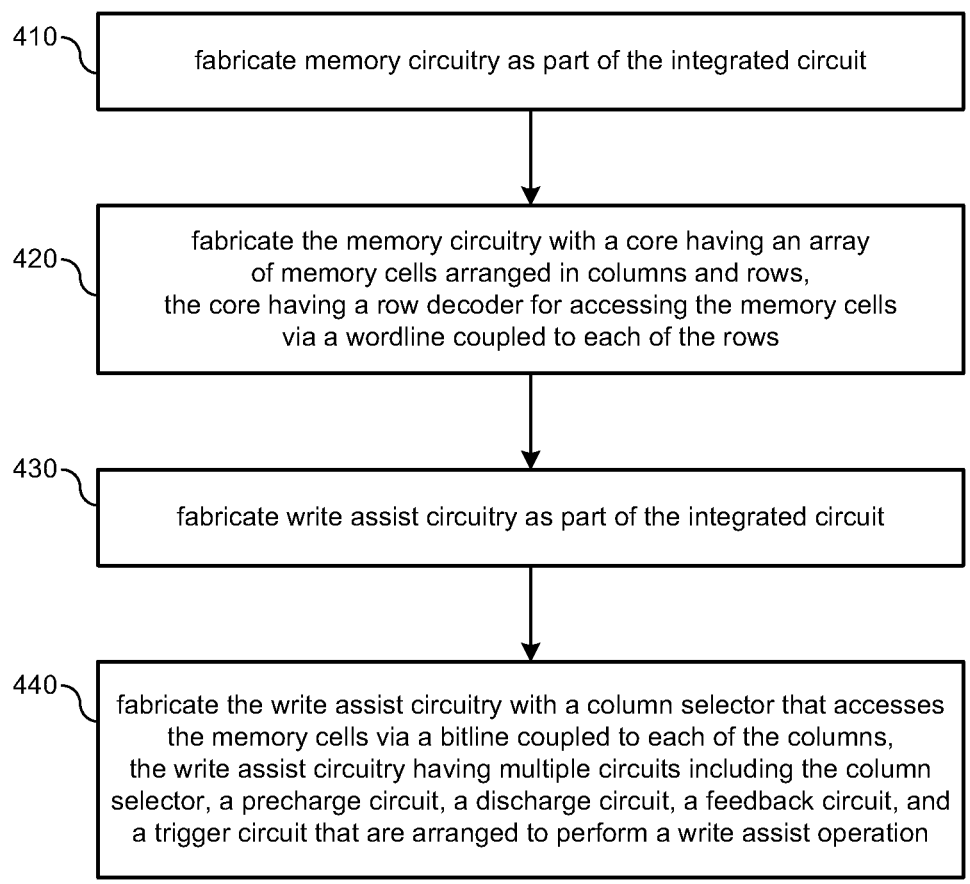
FIG. 4 illustrates a process flow of a method of fabricating write assist circuitry in accordance with various implementations described herein.

FIG. 4 illustrates a process flow of a method 400 for fabricating write assist circuitry in accordance with various implementations described herein.

It should be understood that even though method 400 may indicate a particular order of operation execution, in some cases, various certain portions of the operations may be executed in a different order, and on different systems. In some other cases, additional operations and/or steps may be added to and/or omitted from method 400. Further, method 400 may be implemented in hardware and/or software. If implemented in hardware, the method 400 may be implemented with various circuit components, such as described herein above in reference to FIGS. 1A-3B. If implemented in software, the method 400 may be implemented as a program or software instruction process that may be configured to sense voltage differentials as described herein. Further, if implemented in software, instructions related to implementing the method 400 may be stored in memory and/or a database. For instance, a computer or various other types of computing devices having a processor and memory may be configured to perform method 400.

In reference to FIG. 4, method 400 may be utilized to fabricate an integrated circuit that implements write assist circuitry in memory applications. At block 410, method 400 may fabricate memory circuitry as part of the integrated circuit. Further, at block 420, method 400 may fabricate the memory circuitry with a core having an array of memory cells arranged in columns and rows. The core may include a row decoder (or row decoder circuitry) for accessing the memory cells via a wordline coupled to each of the rows At block 430, method 400 may fabricate write assist circuitry as part of the integrated circuit. Further, at block 440, method 400 may fabricate the write assist circuitry with a column selector that accesses the memory cells via a bitline coupled to each of the columns. The write assist circuitry may include multiple circuits including, e.g., the column selector, a precharge circuit, a discharge circuit, a feedback circuit, and a trigger circuit that are arranged to perform a write assist operation.

The write assist circuitry may be further fabricated with control circuitry having a write driver coupled to the row decoder and the column selector to select a memory cell in the array of memory cells with a wordline signal and a bitline signal. The write driver may write data to the selected memory cell during a write cycle via a selected wordline and a selected bitline. Further, the write assist circuitry may include one or more inverters interposed between the second node and the discharge circuit.

In some implementations, the column selector, the discharge circuit, and the feedback circuit may be coupled to a first node. The first node may be referred to as a tracking node that tracks a core supply voltage (Vddc). The precharge circuit, the trigger circuit, the discharge circuit, and the feedback circuit may be coupled to a second node. The second node may be referred to as a recovery node that discharges the core supply voltage (Vddc). The precharge circuit may enable the write assist circuitry during write cycles. The precharge circuit may disable the write assist circuitry during non-write cycles including read cycles. The precharge circuit may include one or more transistors, such as, e.g., at least one P-type transistor. The trigger circuit may enable the discharge circuit, may discharge the second node, and may be disabled after discharging the second node. The trigger circuit may trigger the write assist circuitry to enable the discharge circuitry, and the trigger circuit may be non-operational during non-write cycles including read cycles. The discharge circuit may discharge the first node. The discharge circuit may include multiple transistors, such as e.g., at least one P-type transistor and at least one N-type transistor. The feedback circuit may track the first node and may disable the discharge circuit to complete the write assist operation. The feedback circuit may include one or more transistors, such as, e.g., at least one P-type transistor.

Described herein are implementations of an integrated circuit. The integrated circuit may include core circuitry having an array of memory cells arranged in columns. The integrated circuit may include write assist circuitry having a column selector that accesses the memory cells via a bitline coupled to each of the columns. The write assist circuitry may include a first node that couples the column selector to a discharge circuit and a feedback circuit. The write assist circuitry may include a second node that couples a trigger circuit to the discharge circuit and the feedback circuit. The trigger circuit may enable the discharge circuit, may discharge the second node, and may be disabled after discharging the second node. The discharge circuit may discharge the first node, and the feedback circuit may track the first node and disables the discharge circuit.

Described herein are implementations of an integrated circuit. The integrated circuit may include memory circuitry having a core with an array of memory cells arranged in columns and rows, and the core may include a row decoder for accessing the memory cells via a wordline coupled to each of the rows. The integrated circuit may include write assist circuitry having a column selector that accesses the memory cells via a bitline coupled to each of the columns. The write assist circuitry may include multiple circuits having the column selector, a precharge circuit, a discharge circuit, a feedback circuit, and a trigger circuit that are arranged to perform a write assist operation. The column selector, the discharge circuit, and the feedback circuit may be coupled to a first node. The precharge circuit, the trigger circuit, the discharge circuit, and the feedback circuit may be coupled to a second node. The precharge circuit may enable the write assist circuitry during write cycles. The trigger circuit may enable the discharge circuit, may discharge the second node, and may be disabled after discharging the second node. The discharge circuit may discharge the first node, and the feedback circuit may track the first node and disables the discharge circuit to complete the write assist operation.

Described herein are implementations of a method for fabricating an integrated circuit. The method may include fabricating memory circuitry as part of the integrated circuit. The memory circuitry may include a core with an array of memory cells arranged in columns and rows, and the core may include a row decoder for accessing the memory cells via a wordline coupled to each of the rows. The method may include fabricating write assist circuitry as part of the integrated circuit. The write assist circuitry may include a column selector that accesses the memory cells via a bitline coupled to each of the columns. The write assist circuitry may include multiple circuits, which may include the column selector, a precharge circuit, a discharge circuit, a feedback circuit, and a trigger circuit that are arranged to perform a write assist operation. The column selector, the discharge circuit, and the feedback circuit may be coupled to a first node. The precharge circuit, the trigger circuit, the discharge circuit, and the feedback circuit may be coupled to a second node. The precharge circuit may enable the write assist circuitry during write cycles, and the trigger circuit may enable the discharge circuit, may discharge the second node, and may be disabled after discharging the second node. The discharge circuit may discharge the first node, and the feedback circuit may track the first node and may disable the discharge circuit to complete the write assist operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   core circuitry having an array of memory cells arranged in columns; and
   write assist circuitry having a column selector that accesses the memory cells via a bitline coupled to each of the columns, the write assist circuitry having a first node that couples the column selector to a discharge circuit and a feedback circuit, the write assist circuitry having a second node that couples a trigger circuit to the discharge circuit and the feedback circuit,
   wherein the trigger circuit enables the discharge circuit, discharges the second node, and is disabled after discharging the second node,
   wherein the discharge circuit discharges the first node, and
   wherein the feedback circuit operates based on a node voltage at the first node and disables the discharge circuit based on the node voltage.

2. The integrated circuit of claim 1, wherein the write assist circuitry comprises multiple circuits having the column selector, the discharge circuit, the feedback circuit, and the trigger circuit that are arranged to perform a write assist operation.

3. The integrated circuit of claim 2, wherein the feedback circuit operates based on the node voltage at the first node and disables the discharge circuit based on the node voltage to complete the write assist operation.

4. The integrated circuit of claim 1, wherein the feedback circuit comprises a P-type transistor.

5. The integrated circuit of claim 1, wherein the write assist circuitry further comprises a precharge circuit that enables the write assist circuitry during write cycles, and wherein the second node couples the precharge circuit to the feedback circuit, the discharge circuit, and the trigger circuit.

6. The integrated circuit of claim 5, wherein the precharge circuit disables the write assist circuitry during non-write cycles including read cycles.

7. The integrated circuit of claim 5, wherein the precharge circuit comprises a P-type transistor.

8. The integrated circuit of claim 1, wherein the trigger circuit triggers the write assist circuitry to enable the discharge circuit, and wherein the trigger circuit is non-operational during non-write cycles including read cycles.

9. The integrated circuit of claim 1, wherein the node voltage at the first node is associated with a core supply voltage (Vddc).

10. The integrated circuit of claim 1, wherein the second node comprises a recovery node that discharges a core supply voltage (Vddc).

11. The integrated circuit of claim 1, wherein the write assist circuitry comprises one or more inverters interposed between the second node and the discharge circuit.

12. The integrated circuit of claim 1, wherein the discharge circuit comprises multiple transistors including a P-type transistor and an N-type transistor.

13. The integrated circuit of claim 1, wherein the array of memory cells are arranged in columns and rows, and wherein the core circuitry utilizes a row decoder for accessing the memory cells via a wordline.

14. The integrated circuit of claim 13, further comprising control circuitry having a write driver coupled to the row decoder and the column selector to select a memory cell in the array of memory cells with a wordline signal and a bitline signal.

15. The integrated circuit of claim 14, wherein the write driver writes data to the selected memory cell during a write cycle via a selected wordline and a selected bitline.

16. An integrated circuit, comprising:
   memory circuitry having a core with an array of memory cells arranged in columns and rows, wherein the core comprises a row decoder for accessing the memory cells via a wordline coupled to each of the rows; and
   write assist circuitry having a column selector that accesses the memory cells via a bitline coupled to each of the columns, wherein the write assist circuitry comprises multiple circuits having the column selector, a precharge circuit, a discharge circuit, a feedback circuit, and a trigger circuit that are arranged to perform a write assist operation,
   wherein the column selector, the discharge circuit, and the feedback circuit are coupled to a first node,
   wherein the precharge circuit, the trigger circuit, the discharge circuit, and the feedback circuit are coupled to a second node,
   wherein the precharge circuit enables the write assist circuitry during write cycles;
   wherein the trigger circuit enables the discharge circuit, discharges the second node, and is disabled after discharging the second node,
   wherein the discharge circuit discharges the first node, and wherein the feedback circuit operates based on a node voltage at the first node and disables the discharge circuit based on the node voltage to complete the write assist operation.

17. The integrated circuit of claim 16, wherein the feedback circuit comprises a P-type transistor, wherein the precharge circuit comprises a P-type transistor, and wherein the discharge circuit comprises multiple transistors including a P-type transistor and an N-type transistor.

18. The integrated circuit of claim 16, wherein the node voltage at the first node is associated with a core supply voltage (Vddc), and wherein the second node comprises a recovery node that discharges the core supply voltage (Vddc).

19. The integrated circuit of claim 16, wherein the write assist circuitry comprises one or more inverters interposed between the second node and the discharge circuit.

20. A method for fabricating an integrated circuit, comprising:

fabricating memory circuitry as part of the integrated circuit, the memory circuitry having a core with an array of memory cells arranged in columns and rows, wherein the core includes a row decoder for accessing the memory cells via a wordline coupled to each of the rows; and fabricating write assist circuitry as part of the integrated circuit, the write assist circuitry having a column selector that accesses the memory cells via a bitline coupled to each of the columns, the write assist circuitry having multiple circuits including the column selector, a precharge circuit, a discharge circuit, a feedback circuit, and a trigger circuit that are arranged to perform a write assist operation, wherein the column selector, the discharge circuit, and the feedback circuit are coupled to a first node, wherein the precharge circuit, the trigger circuit, the discharge circuit, and the feedback circuit are coupled to a second node, wherein the precharge circuit enables the write assist circuitry during write cycles;

wherein the trigger circuit enables the discharge circuit, discharges the second node, and is disabled after discharging the second node, wherein the discharge circuit discharges the first node, and wherein the feedback circuit operates based on a node voltage at the first node and disables the discharge circuit based on the node voltage to complete the write assist operation.

* * * * *